(12) United States Patent
Hayashi et al.

(10) Patent No.: US 7,468,490 B2
(45) Date of Patent: Dec. 23, 2008

(54) CIRCUIT SUBSTRATE AND ELECTRONIC APPARATUS, FABRICATION PROCESS THEREOF

(75) Inventors: Nobuyuki Hayashi, Kawasaki (JP); Yoshihiko Imanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 359 days.

(21) Appl. No.: 11/507,505

(22) Filed: Aug. 22, 2006

(65) Prior Publication Data
US 2007/0230151 A1    Oct. 4, 2007

(30) Foreign Application Priority Data
Mar. 31, 2006    (JP) ............... 2006-100597

(51) Int. Cl.
*H05K 1/03*    (2006.01)

(52) U.S. Cl. .............. 174/255; 174/260; 361/795

(58) Field of Classification Search ............... 174/255, 174/260; 361/306.1, 306.2, 306.3, 795; 257/690–692, 257/686
See application file for complete search history.

(56) References Cited
U.S. PATENT DOCUMENTS
2006/0138591 A1*    6/2006    Amey et al. ............ 257/532
2007/0090511 A1*    4/2007    Borland et al. ............ 257/691
2007/0230089 A1*    10/2007    Tsai ............ 361/311
2008/0142253 A1*    6/2008    Salama et al. ............ 174/258

FOREIGN PATENT DOCUMENTS
JP    2003-133507    5/2003

* cited by examiner

*Primary Examiner*—Dean A. Reichard
*Assistant Examiner*—Yuriy Semenenko
(74) *Attorney, Agent, or Firm*—Kratz, Quintos & Hanson, LLP

(57) ABSTRACT

A circuit substrate comprises a lamination of plural resin insulation films and includes, on a surface and in an interior of the circuit substrate, plural interconnection layers. One of the plural resin insulation films is formed on a first conductor pattern constituting one of the plural interconnection layers in such a manner that a bottom principal surface of the resin insulation film makes a contact with a surface of the first conductor pattern, the resin insulation film including an opening defined by a sloped surface and exposing the first conductor pattern at the bottom principal surface. A ceramic high-K dielectric film is formed at a bottom of the opening in contact with the surface of the first conductor pattern, wherein there is formed a second conductor pattern constituting one of the plural interconnection layers on the resin insulation film so as to cover the sloped surface and in contact with a surface of the ceramic high-K dielectric film.

8 Claims, 10 Drawing Sheets

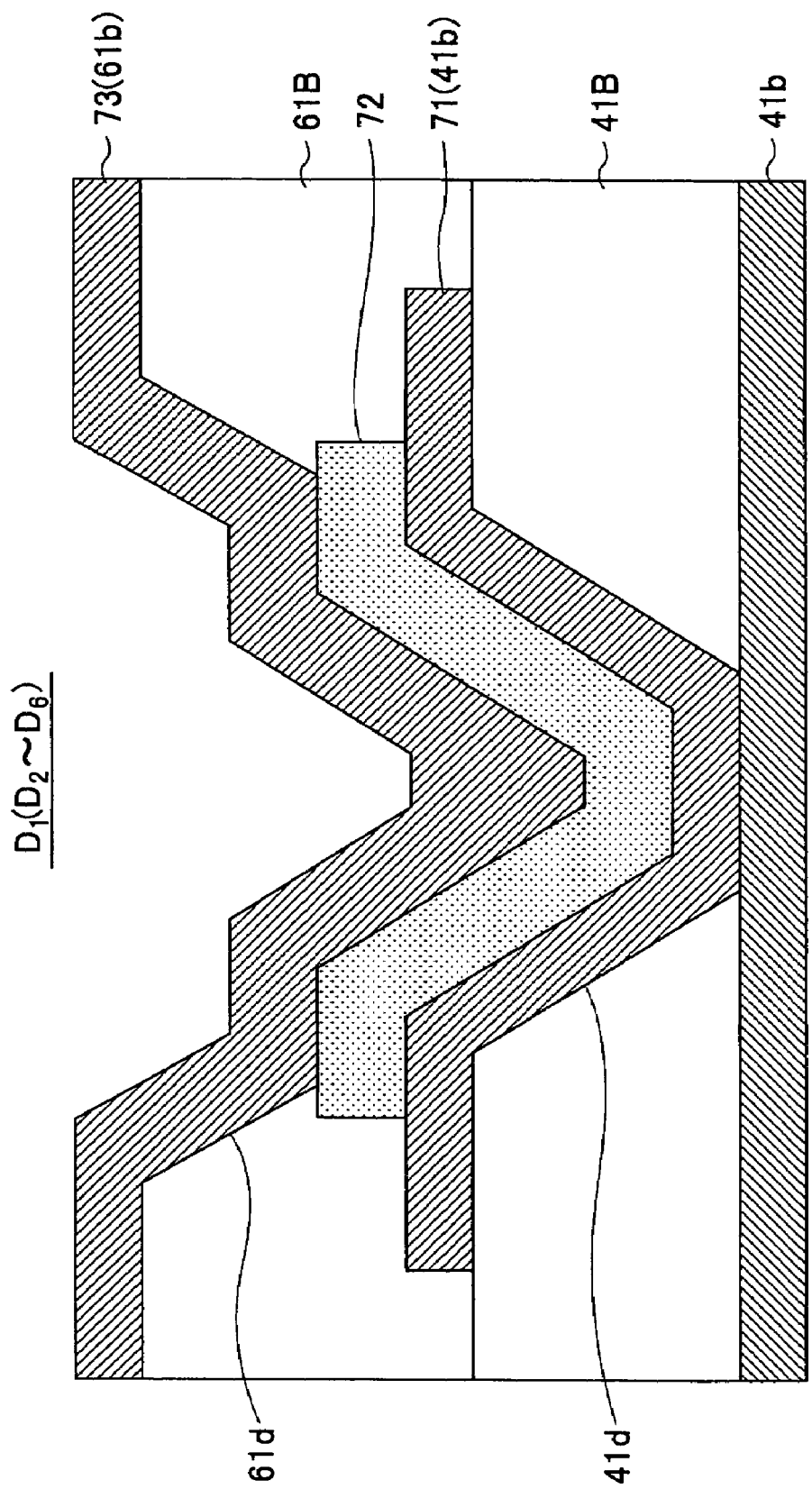

CIRCUIT SUBSTRATE AND ELECTRONIC APPARATUS, FABRICATION PROCESS THEREOF

CROSS-REFERENCE TO RELATED APPLICATION

The present application is based on Japanese priority application No. 2006-100597 filed on Mar. 31, 2006, the entire contents of which are hereby incorporated by reference.

BACKGROUND OF THE INVENTION

The present invention generally relates to electron devices and more particularly to a resin circuit substrate integrating therein a ceramic capacitor and an electronic apparatus that uses such a resin circuit substrate.

Generally, an electronic apparatus is formed by mounting active elements such as LSIs and passive elements such as capacitors on a resin circuit substrate. In highly miniaturized high-performance electronic apparatuses of these days, in particular, there exists a demand for integrating passive elements, especially ceramic capacitors, into the circuit substrate.

Thus, there have been made proposals for the technology of mounting a ceramic chip capacitor in a depression formed in a build-up circuit substrate. On the other hand, in order to decrease the thickness of the circuit substrate further and to decrease the inductance of current path through the circuit substrate, and further to suppress unnecessary electromagnetic radiation from such a current path through the circuit substrate, it is preferable to form the ceramic capacitor in the resin layer constituting the build-up substrate directly in a unitary body.

Patent Reference 1 Japanese Laid-Open Patent Application 2003-133507 official gazette

SUMMARY OF THE INVENTION

FIG. 1 shows the construction of an electronic apparatus 10 that uses a resin circuit substrate 11 integrating therein a ceramic capacitor according to a related art of the present invention.

Referring to FIG. 1, the resin circuit substrate 11 has a laminated structure and formed of a core layer 11A of glass epoxy and resin build-up layers 11B and 11C disposed respectively on the top and bottom surfaces of the core layer 11A, wherein there are formed Cu interconnection patterns 11a and a through-via hole 11t in the core layer 11A. Further, Cu interconnection patterns 11b and 11c are formed in the interior and on the surface of the resin build-up layers 11B and 11C, respectively. On the build-up layer 11B, semiconductor devices 13A and 13B containing therein an LSI chip are mounted in a face down state in contact with the Cu interconnection layer 11b formed on the surface of the build-up layer 11B. Further, semiconductor devices 13C and 13D containing therein a LSI chip are mounted on the build-up layer 11C in the face down state in contact with the Cu interconnection layer 11c formed on the surface of the build-up layer 11C. In correspondence to this, each of the build-up layers 11B and 11C are formed by laminating plural build-up layers so as to sandwich Cu interconnection patterns 11b and 11c therein.

Further, with the semiconductor device 10 of FIG. 1, a ceramic capacitor 14A is mounted on the build-up layer 11B in a face down state in contact with the Cu interconnection layer 11b formed on the surface of the build-up layer 11B, and ceramic capacitors 14D and 14E are mounted in a face down state similarly in contact with the Cu interconnection layer 11c formed on the surface of the build-up layer 11C.

Further, in the example of FIG. 1, ceramic capacitors 14B and 14C are formed inside the build-up substrate 11B in electrical connection to the Cu interconnection pattern inside the build-up substrate 11B.

Generally, a baking process at the temperature of several hundred to one thousand Celsius or more is required for formation of capacitor insulation film in a ceramic capacitor, and thus, it is not possible to integrate a ceramic capacitor directly on a resin substrate. Because of this, the ceramic capacitors 14A, 14C, 14D and 14E are attached to the Cu interconnection pattern 11b or 11c on the circuit substrate 11 externally. Similarly, the ceramic capacitors 14B and 14C inside the build-up substrate 11B are formed by attaching a capacitor chip formed separately elsewhere upon the Cu interconnection pattern inside the build-up layer 11B or 11C during the process of forming the build-up layers 11B or 11C. With such a capacitor attached externally, there is a need of extending the interconnection pattern on the substrate as noted before, while such extension of the interconnection pattern invites problems such as increase of inductance, deterioration of high-frequency characteristics, increase of unnecessary electromagnetic radiation, and the like.

Meanwhile, there has been proposed a so-called aerosol deposition process as the technology that enables formation of ceramic dielectric film at a low temperature such as room temperature.

With an aerosol deposition process, aerosol is formed by ceramic ultrafine particles of the diameter of 1 μm or less, preferably 0.5 μm or less, and the aerosol thus formed are subjected to cause collision with a substrate at high speed in a vacuum processing chamber. With this technology, a ceramic dielectric film can be formed at low temperatures such as room temperature by impact solidification of ceramic fine particles.

Further, there is a known technology of forming a ceramic film with a low temperature process, such as sputtering process.

Thus, the present invention provides an electron device in which the wiring length to the capacitor is minimized by directly integrating a ceramic capacitor in a multilayer resin circuit substrate by using such a low temperature process.

According to an aspect of the present invention, there is provided a circuit substrate and an electronic apparatus that uses such a circuit substrate, said circuit substrate comprising a lamination of plural resin insulation films and including, on a surface and in an interior thereof, plural interconnection layers, one of said plural resin insulation films being formed on a first conductor pattern constituting one of said plural interconnection layers in such a manner that a bottom principal surface of said resin insulation film makes a contact with a surface of said first conductor pattern, said resin insulation film including an opening defined by a sloped surface and exposing said first conductor pattern at said bottom principal surface, a ceramic high-K dielectric film being formed at a bottom of said opening in contact with said surface of said first conductor pattern, wherein there is formed a second conductor pattern constituting one of said plural interconnection layers on said resin insulation film so as to cover said sloped surface and in contact with a surface of said ceramic high-K dielectric film.

In another aspect, there is provided a circuit substrate and an electronic apparatus that uses such a circuit substrate, said circuit substrate comprising a lamination of plural resin insulation films and including, on a surface and in an interior thereof, plural interconnection layers, said circuit substrate comprising:

a first resin insulation film constituting one of said plural resin insulation films and formed over a first conductor pattern constituting one of said plural interconnection layers, in such a manner that a bottom principal surface of said first resin insulation film makes a contact with a surface of said first conductor pattern, said first resin insulation film including a first opening defined by a sloped surface, said first opening exposing said first conductor pattern at a bottom of said first opening;

a lower electrode pattern formed over said first resin insulation film in contact with a surface of said first conductor pattern exposed at said bottom of said first opening, said lower electrode pattern having a shape conformal to a shape of said sloped surface of said first opening and having a depressed top surface corresponding to said first opening;

a second resin insulation film constituting one of said plural resin insulation films and formed over said first resin insulation film so as to cover said lower electrode pattern, said second resin insulation film including a second opening formed in correspondence to said first opening and exposing said lower electrode pattern, a ceramic high-K dielectric film formed in said second opening on said depressed top surface of said lower electrode pattern in conformity with a shape of said depressed top surface of said lower electrode pattern, said ceramic high-K dielectric film having a depressed top surface conformal to a shape of said depressed top surface of said lower electrode pattern, wherein there is provided a second conductor pattern constituting one of said plural interconnection layers on said second resin insulation film such that said second conductor pattern makes a contact with said depressed top surface of said ceramic high-K dielectric film at said second opening.

In another aspect, the present invention provides a method of producing a circuit substrate in the form of lamination of plural resin insulation films such that plural interconnection layers are formed on a surface and in an interior of said circuit substrate, one of said plural resin insulation films being formed on a first conductor pattern constituting one of said plural interconnection layers in such a manner that a principal surface of said insulation film makes a contact with a surface of said first conductor pattern, said method comprising the steps of:

forming an opening in said insulation film by a laser beam processing such that said first conductor pattern is exposed;

forming a ceramic high-K dielectric film at a bottom of said opening in contact with said first conductor pattern selectively by an aerosol deposition process; and forming a second conductor pattern on said insulation film in contact with said high-K dielectric ceramic film in said opening.

In a further aspect, the present invention provides a method of producing a circuit substrate in the form of lamination of plural resin insulation films such that plural interconnection layers are formed on a surface and in an interior of said circuit substrate, comprising the steps of:

forming a first insulation film constituting one of said plural resin insulation films on a first conductor pattern constituting one of said plural interconnection layers, such that a bottom principal surface of said first insulation film makes a contact with a surface of said first conductor pattern;

forming a first opening in said first insulation film by a laser beam processing such that said first opening exposes said conductor pattern;

forming a lower electrode pattern on said first insulation film so as to cover a sidewall surface of said first opening and make contact with said first conductor pattern at a bottom of said opening;

forming a second insulation film constituting one of said plural resin insulation films over said first insulation film so as to cover said lower electrode pattern;

forming a second opening in said second insulation film in correspondence to said first opening by a laser beam processing such that said second opening exposes said lower electrode pattern;

forming a ceramic high-K dialectic film on said exposed lower electrode pattern selectively by an aerosol deposition process; and forming an upper electrode pattern on said second insulation film so as to cover said ceramic high-K dielectric film at said second opening.

According to the present invention, it become possible to integrate a capacitor having a ceramic high-K dielectric film inside a resin substrate directly, by using an aerosol deposition process. Thereby, high frequency characteristics are improved for the electronic apparatuses that use the circuit substrate of the present invention as a result of decrease of inductance attained by decrease of capacitor wiring length. Further, it becomes possible to suppress unnecessary electromagnetic radiation as a result of decrease of the capacitor wiring length.

Other objects and further features of the present invention will become apparent from the following detailed description when read in conjunction with the attached drawings.

BRIEF DESCRIPTION OF THE DRAWINGS

FIG. 7 is a diagram showing the capacitor formed in the circuit substrate of FIG. 6;

DETAILED DESCRIPTION OF THE INVENTION

Figure 1:
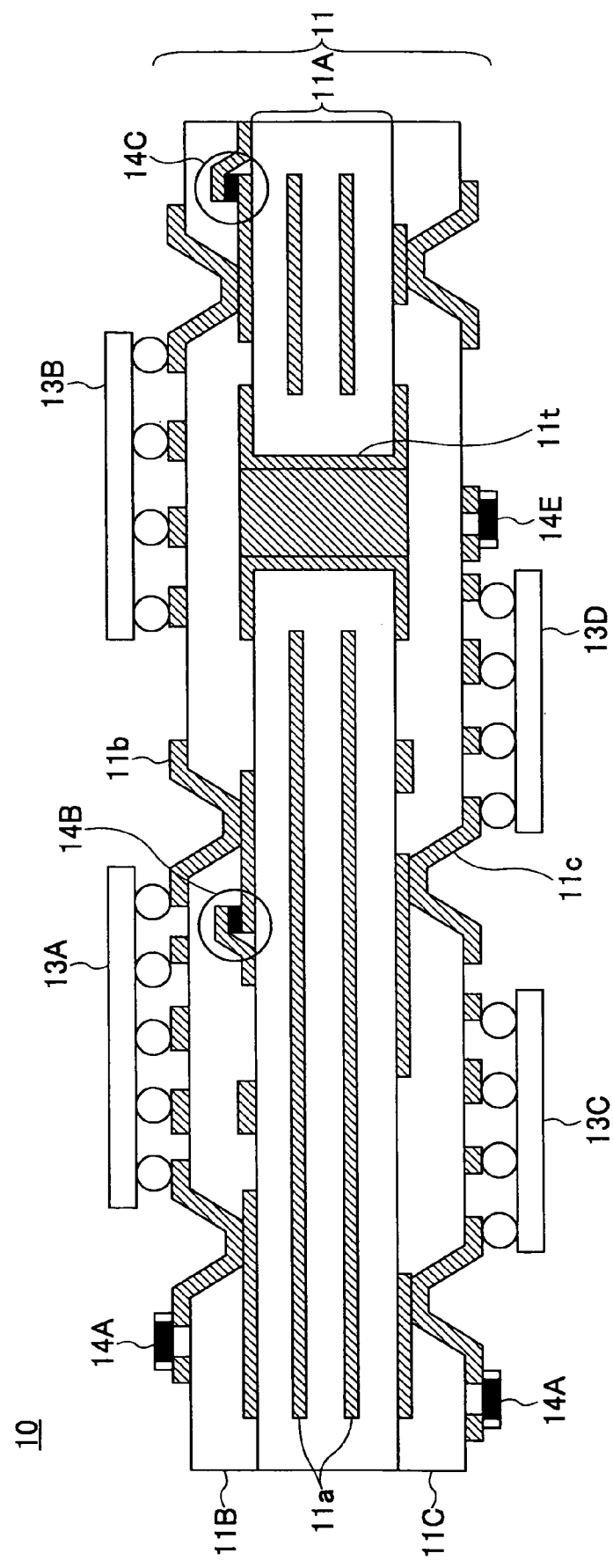
FIG. 1 is a diagram showing a circuit substrate and an electronic apparatus according to a related art of the present invention.
Figure 2:
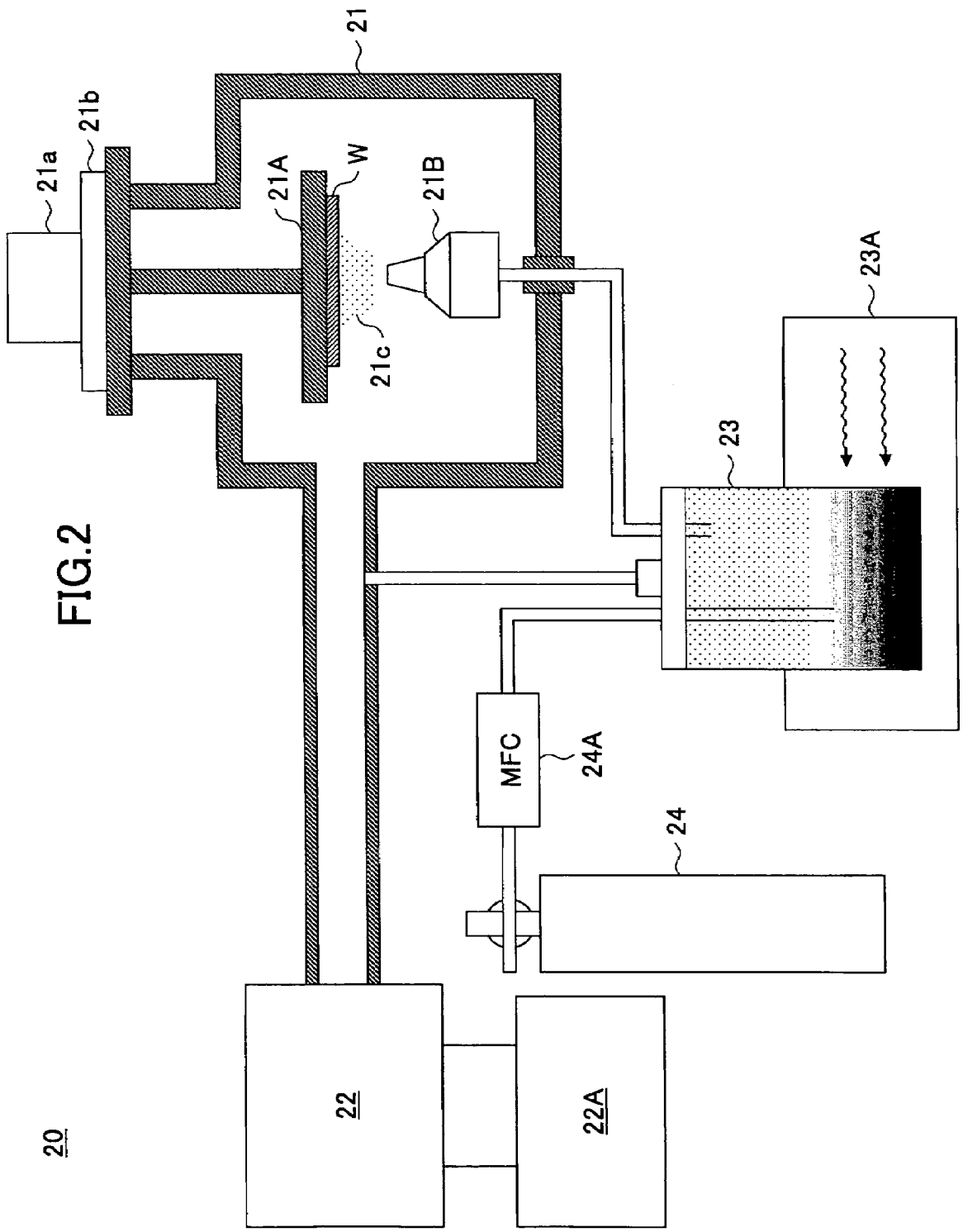
FIG. 2 is a diagram showing the construction of an aerosol deposition apparatus used with the present invention.

FIG. 2 shows the construction of an aerosol deposition apparatus 20 used with the present invention.

Referring to FIG. 2, the aerosol deposition apparatus 20 includes a processing vessel 21 evacuated by a mechanical booster pump 22 and a vacuum pump 22A, wherein the processing vessel 21 includes therein a stage 21A holding thereon a substrate 21A to be processed via an X-Y stage driving mechanism 21a and a Z-stage driving mechanism 21b, such that the substrate W to be processed is driven as desired in the X-Y-Z-θ direction.

In the processing vessel 21, there is provided a nozzle 21B in the direction to the substrate W on the stage 21A, wherein the nozzle 21B is supplied with aerosol of a ceramic material together with a carrier gas and sprays the aerosol on the surface of the substrate W in the form of a jet 21c.

As noted before, the ceramic particles constituting the aerosol thus sprayed has a particle diameter of preferably 0.5 μm or less and form a ceramic film upon impact solidification on the surface of the substrate W.

In order to supply the aerosol to the nozzle 21B, there is provided a source vessel 23 holding a ceramic powder source material of the particle diameter of preferably 0.5 μm or less with the aerosol deposition apparatus 20 of FIG. 2, and a carrier gas such as an inert gas or high purity oxygen gas is supplied to the source vessel 23 from a high pressure gas source 24 via a mass flow controller 24A. Further, in order to promote formation of the aerosol, the source vessel 23 is held on a vibrating base 23A. The source vessel 23 is held in a decompression state by the mechanical booster pump 22 and the vacuum pump 22A prior to the film formation process, and with this, moisture is removed from the ceramic powder source material.

FIRST EMBODIMENT

Figure 3:
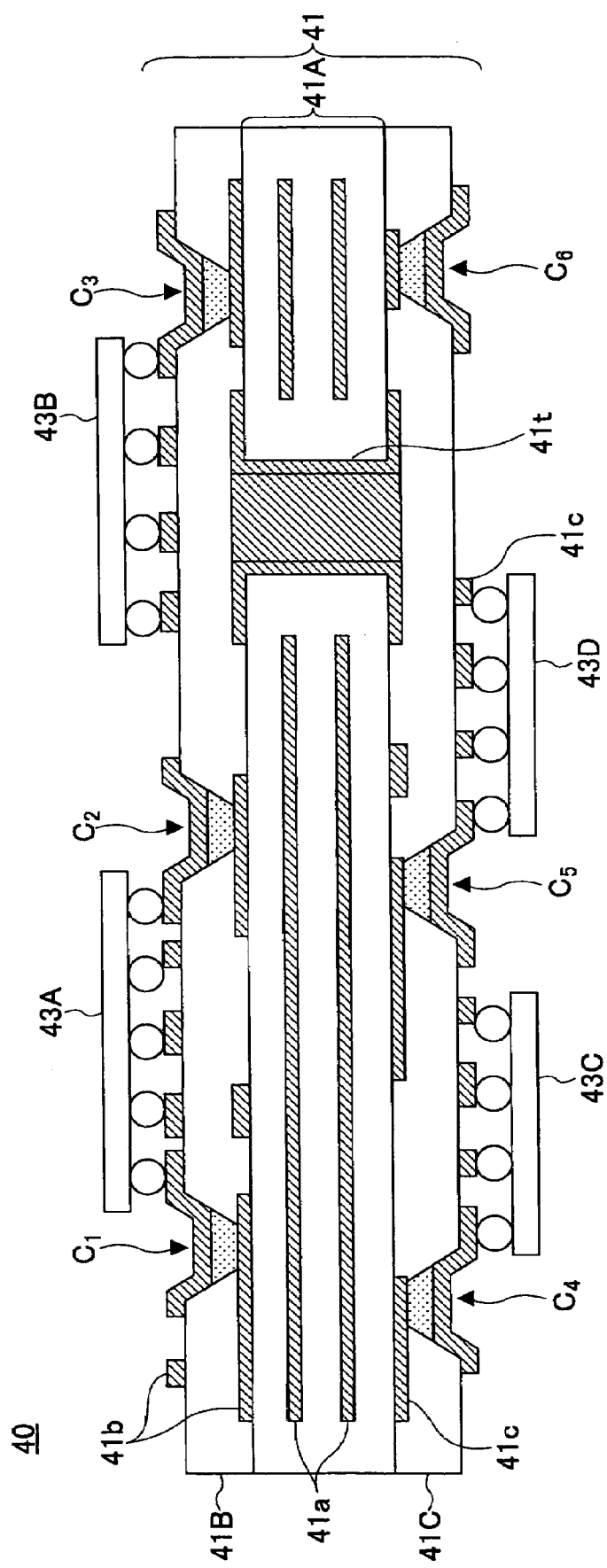
FIG. 3 is a diagram showing a circuit substrate and an electronic apparatus according to a first embodiment of the present invention.

FIG. 3 shows the construction of an electronic apparatus 40 according to a first embodiment of the present invention.

Referring to FIG. 3, the electronic apparatus 40 is formed on a circuit substrate 41 and includes the circuit substrate 41 and semiconductor devices 43A, 43B, 43 C and 43D mounted upon the circuit substrate 41.

The circuit substrate 41A comprises a core layer 41A of glass epoxy, or the like, a build-up resin insulation layer 41B formed on the top surface of the core layer 41A, and a build-up resin insulation layer 41C is formed on the bottom surface of the core layer 41A, wherein interconnection patterns 41a are formed inside the core layer 41A. Further, a through-via hole 41t is formed in the core layer 41A.

On the bottom surface and the top surface of the build-up resin insulation layer 41B, there are formed Cu interconnection patterns 41b, while Cu interconnection patterns 41c are formed similarly on the bottom surface and the top surface of the build-up resin insulation film 41C.

Further, semiconductor devices 43A and 43B are mounted on the build-up resin insulation film 41B in contact with Cu interconnection pattern 41b exposed at the top surface, and semiconductor devices 43C and 43D are mounted on the build-up insulation film 41C in contact with the Cu interconnection patterns 41c exposed at the bottom surface.

Further, capacitors C1-C3, each having a ceramic high-K dielectric film for the capacitor insulation film, are formed on the build-up resin insulation layer 41B, and similar capacitors C4-C6 each having a ceramic high-K dielectric film for the capacitor insulation film are formed on the build-up resin substrate 41C.

Figure 4:
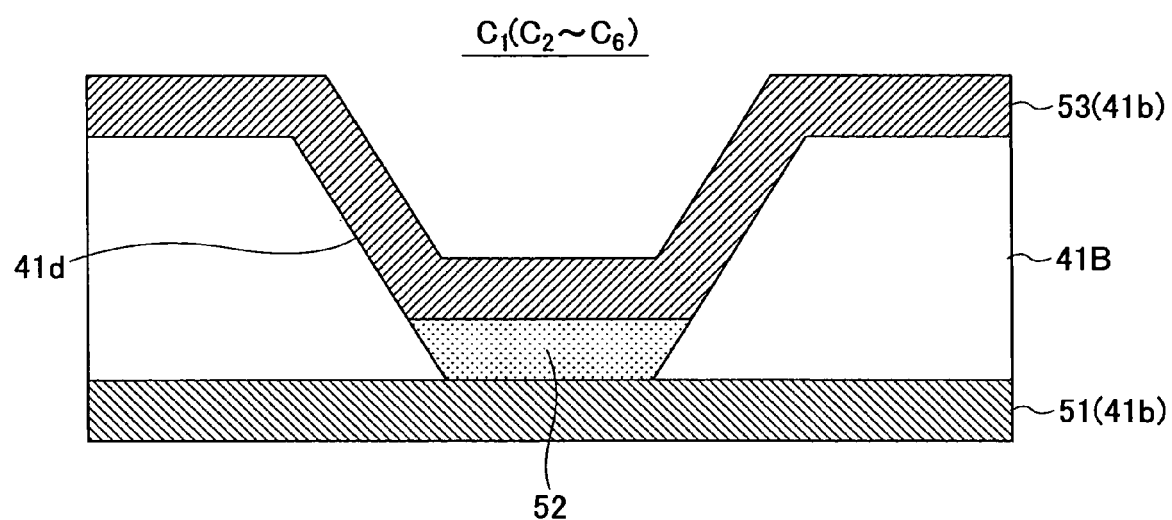
FIG. 4 is a diagram showing the capacitor formed in the circuit substrate of FIG. 3 with magnification.

FIG. 4 shows the construction of the capacitor C1 in detail. Because the capacitors C2-C6 have a similar construction, the explanation thereof will be omitted.

Referring to FIG. 4, the capacitor C1 is integrated inside the build-up resin insulation layer 41B and includes: a Cu lower electrode 51 constituting a part of the Cu interconnection pattern 41b at the bottom surface of the layer 41B; an opening 41d formed in the build-up resin insulation layer 41B so as to expose the Cu lower electrode 51; and a ceramic high-K dielectric film 52 typically of $BaTiO_3$, MgO, $Al_2O_3$, and the like, formed on the lower electrode 51 exposed at the bottom part of the opening 41d.

The opening 41d is formed in the build-up resin layer 41B by a laser beam processing with a diameter of 0.02-0.2 mm and is defined by a sloped surface that increases the diameter of the opening continuously from the lower part of the build-up resin layer 41B to the upper part.

The ceramic high-K dielectric film 52 is formed in contact with the lower electrode 51 and the sloped surface 41d, wherein an upper electrode 53 is formed on the build-up resin layer 41B so as to cover the exposed part of the sloped surface 41d in contact with the ceramic high-K dielectric film 52. Here, it should be noted that the upper electrode 53 constitutes a part of Cu interconnection pattern 41b formed on the build-up resin layer 41B.

With the construction of FIG. 4, it should be noted that the ceramic high-K dielectric film 52 is formed so as to contact with the build-up resin layer 41B directly. In order to realize such a structure, there is a need that the ceramic high-K dielectric film 52 is formed at a low temperature below the heat-resistant temperature of build-up resin layer 41B.

Thus, the present invention forms the ceramic high-K dielectric film 52 by using the aerosol deposition apparatus shown in FIG. 2.

More specifically, the particles of high-K dielectric ceramic such as $BaTiO_3$, MgO, $Al_2O_3$, and the like, having an average particle diameter of preferably 0.5 μm or less, are introduced into the source vessel 23, and moisture is removed therefrom by a vacuum evacuation process by driving the pumps 22 and 22A. Thereafter, an oxygen gas or inert carrier gas such as Ar, He, Ne, Xe, Kr, nitrogen, and the like, for example, is supplied to the source vessel 23 from the high-pressure gas source 24 via the MFC 24A with a pressure of 2 $kg/cm^2$.

The carrier gas thus supplied causes formation of aerosol inside the source vessel 23 for the ceramic particles held in the source vessel 23, and the aerosol thus formed is fed to the nozzle 21B by pressure of the carrier gas. The aerosol thus fed to the nozzle 21B is then sprayed upon the substrate to be processed in the form of a jet 21c with a high speed of 50 m/s-1000 m/s. Thereby, the aerosol particles colliding with the exposed surface of the lower electrode 51 cause impact solidification, and the ceramic high-K dielectric film 52 is formed on the lower electrode 51.

On the other hand, the aerosol fine particles that have collided upon the build-up resin film 41B do not cause impact solidification but are merely reflected. Because of this, the ceramic high-K dielectric film 52 is formed selectively in the exposed part of the lower electrode 51.

Referring to FIG. 3 again, it becomes possible to form the capacitors C1-C6 integrally to the circuit substrate 41 in the vicinity of the semiconductor devices 43A-43D by using the aerosol deposition process.

Here, it should be noted that the semiconductor devices 43A-43D may be an LSI chip or a package substrate or module substrate on which an LSI chip is mounted. In the case that the semiconductor devices 43A-43D are an LSI chip, in particular, the capacitors C1-C5 are formed in the close proximity of the LSI chip with such a construction, and it becomes possible to suppress the problem of increase inductance or unnecessary electromagnetic radiation, which is caused in the case the capacitor wiring is provided separately for connection to a ceramic capacitor chip mounted externally.

Next, the fabrication process of the circuit substrate 41 of the FIG. 3 will be explained with reference to FIGS. 5A-5H.

Figure 5A:
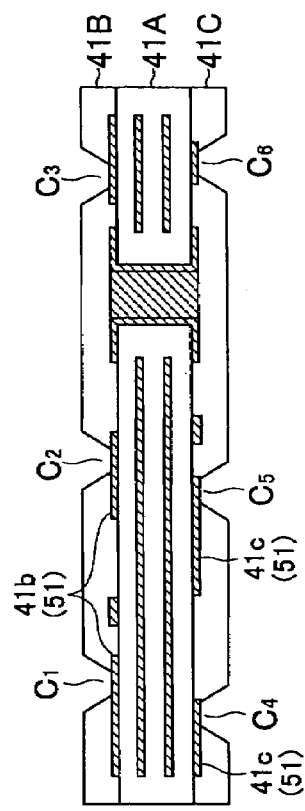
FIGS. 5A-5H are diagrams showing the fabrication process of the circuit substrate and the electronic apparatus of FIG. 3.
Figure 5C:
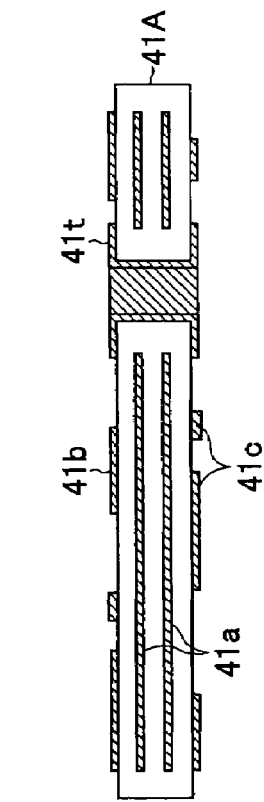
Figure 5B:
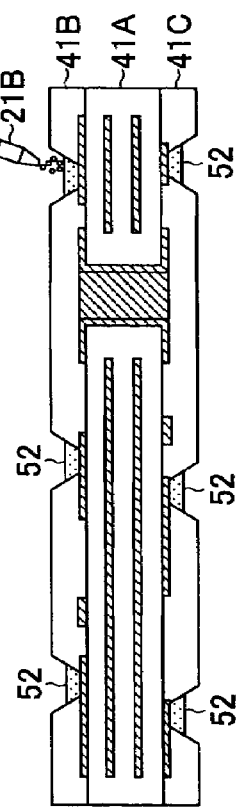

Referring to FIG. 5A, there is conducted a process for forming the core layer 41A including therein the Cu interconnection patterns 41a and the through-via holes 41t at first, by using a multilayer substrate of glass epoxy, or the like, and the-build-up resin layers 41B and 41C are formed respectively on the top surface and bottom surface of the core layer 41A in the step of FIG. 5B.

Next, in the step of FIG. 5C, openings c1-c6 are formed in the regions of the build-up resin layer 41B or 41C reserved for the capacitors C1-C6 by a laser beam processing that uses a $CO_2$ laser, for example, so as to expose the Cu interconnection pattern 41b or 41c as the lower electrode 51.

Figure 5D:
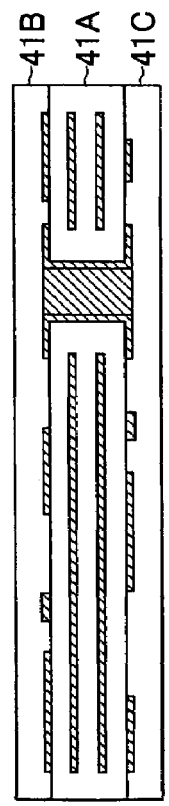

Next, in the step of FIG. 5D, the high-K dielectric ceramic film 52 such as $BaTiO_3$ and MgO, $Al_2O_3$, or the like, is formed selectively on the lower electrode 51 exposed at the openings c1-c6 while using the aerosol deposition apparatus 21B of the FIG. 2. As explained previously, the ceramic high-K dielectric film 52 causes deposition selectively on the exposed lower electrode 51 with the use of the aerosol deposition process, and resist process or patterning process can be eliminated.

Figure 5E:
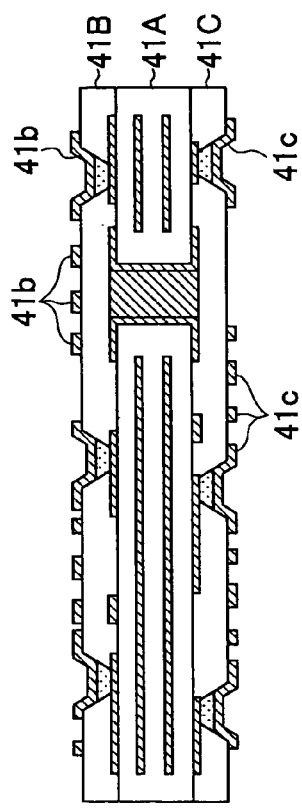

Next, in the step of FIG. 5E, a roughening processing is applied to the surfaces of the build-up insulation films 41B and 41C of FIG. 5D, and thin Cu seed layers 411B and 411C of the thickness of about 3 μm are formed further on the build-up insulation films 41B and 41C with a non-electrolytic plating process so as to include the openings c1-c6 and the ceramic high-K dielectric films 52 formed therein.

Figure 5F:
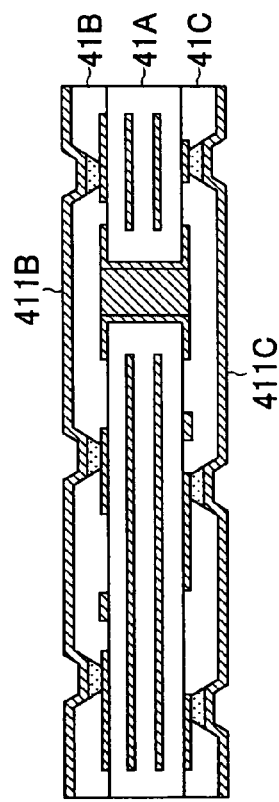

Further, in the step of FIG. 5F, resist patterns 412B and 412C having openings in correspondence to the regions reserved for the Cu interconnection patterns 41b and 41c, are formed on the Cu seed layers 411B and 411C, and electrolytic plating process of Cu is conducted while using the resist patterns 412B and 412C as a plating mask. With this, the uppermost Cu interconnection pattern 41b is formed on the build-up insulation film 41B and the uppermost Cu interconnection pattern 41c is formed on the build-up insulation film 41C. Thereby, a part of the Cu interconnection pattern 41b constitutes the upper electrode 53 of the capacitors C1-C6 formed in the build-up insulation film 41B.

Figure 5G:
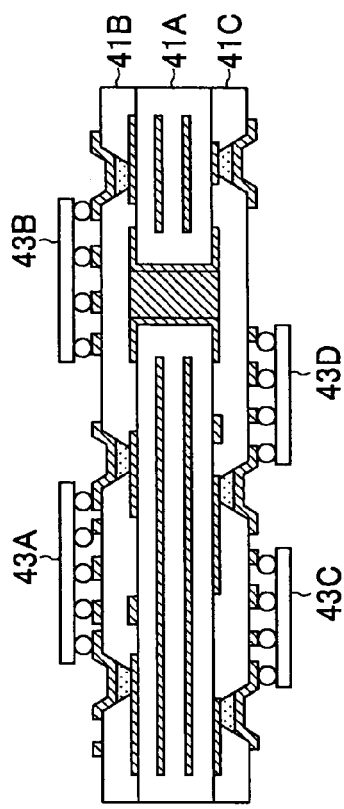
Figure 5H:
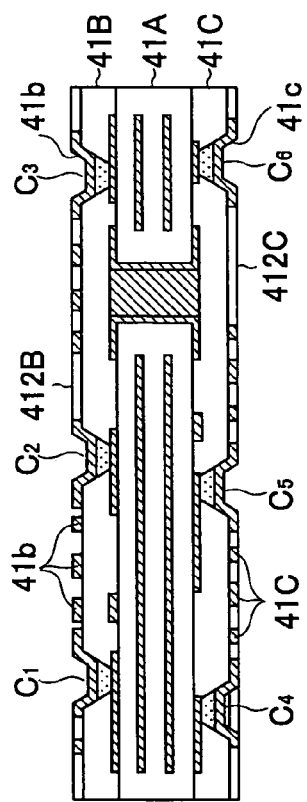

Further, in the step of FIG. 5G, the resist patterns 411B and 412B are removed, and in the step of FIG. 5H, the semiconductor chips 43A and 43B are mounted upon the uppermost Cu interconnection pattern 41b on the build-up insulation film 41B. Further, the semiconductor chips 43C and 43D are mounted upon the uppermost Cu interconnection pattern 41c on the build-up insulation film 41C.

SECOND EMBODIMENT

Figure 6:
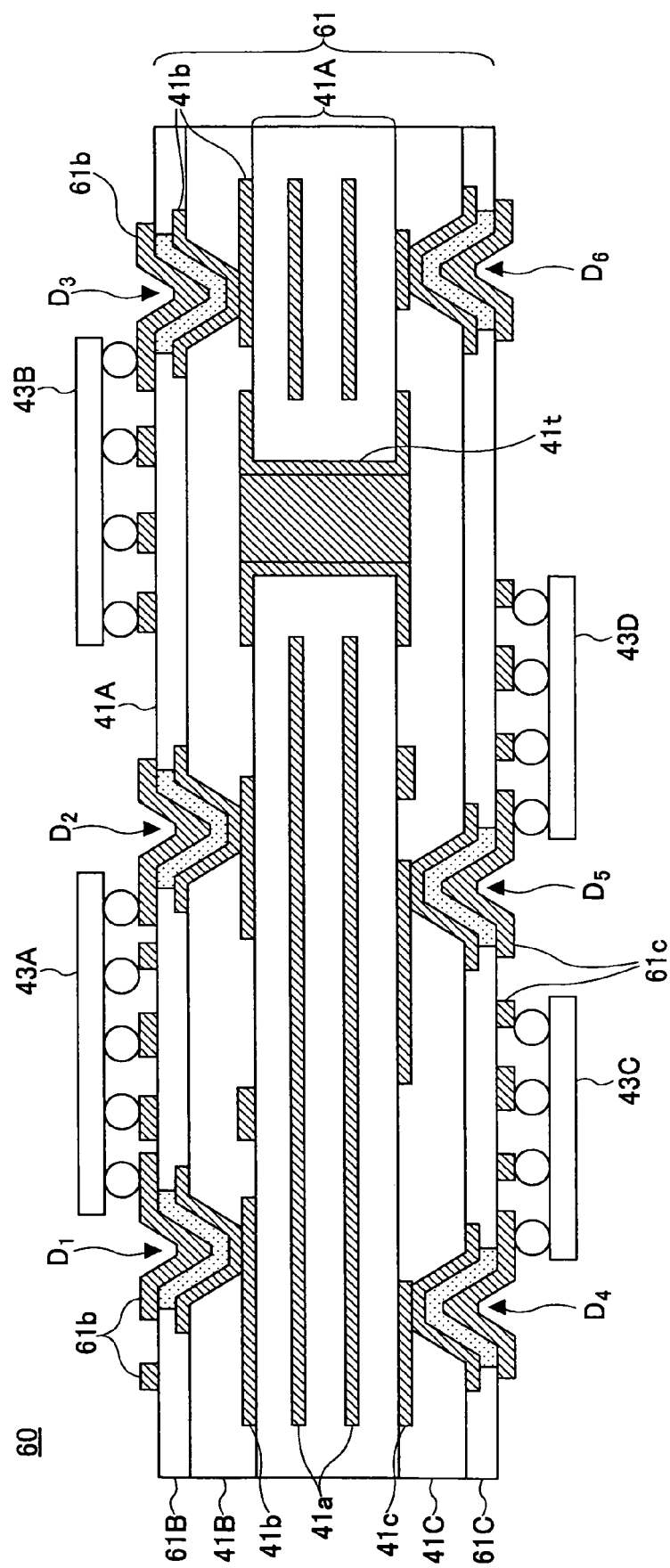
FIG. 6 is a diagram showing a circuit substrate and an electronic apparatus according to a second embodiment of the present invention.

FIG. 6 shows the construction of an electronic apparatus 60 according to a second embodiment of the present invention, wherein those parts corresponding to the parts explained previously are designated by the same reference numerals and the description thereof will be omitted.

Referring to FIG. 6, the electronic apparatus 60 is formed on a circuit substrate 61 and includes the semiconductor devices 43A, 43B, 43C and 43D mounted thereon.

The circuit substrate 61 includes: the core layer 41A; the resin build-up layer 41B formed on a top surface of the core layer 41A and the resin build-up layer 41C formed on a bottom surface of the core layer 41A; a resin build-up layer 61B formed on the resin build-up layer 41B; and a resin build-up layer 61C formed on the resin build-up layer 41C, wherein the Cu interconnection patterns 41a and the through-via hole 41t are formed in the core layer 41A, the Cu interconnection patterns 41b are formed on the top surface and bottom surface of the resin build-up layer 41B, the Cu interconnection pattern 41c are formed on the top surface and bottom surface of the resin build-up layer 41C, a Cu interconnection pattern 61b is formed on the top surface of the resin build-up layer 61B, and a Cu interconnection pattern 61c is formed on the top surface of the resin build-up layer 61C (the bottom surface of the circuit substrate 61). Further, the semiconductor devices 43A and 43B are mounted upon the Cu interconnection pattern 61b in a facedown state on the resin build-up layer 61B, and the semiconductor devices 43C and 43D are mounted on the Cu interconnection pattern 61c in the facedown state on the resin build-up layer 61C.

With the present embodiment, capacitors D1-D3 are formed in the resin build-up layer 61B in place of the capacitors C1-C3 in such a manner that each of the capacitors D1-D3 is sandwiched between the Cu interconnection pattern 41b on the top surface of the resin build-up layer 41B and the Cu interconnection pattern 61b on the top surface of the resin build-up layer 61B. Similarly, capacitors D4-D6 are formed in the resin build-up layer 61C in place of the capacitors C4-C6 in such a manner that each of the capacitors D4-D6 is sandwiched between the Cu interconnection pattern 41b on the top surface of the resin build-up layer 41C and the Cu interconnection pattern 61c on the top surface of the resin build-up layer 61C.

FIG. 7 shows the construction of the capacitor D1. Because the capacitors D2-D6 have a similar construction, explanation of the capacitors D1-D6 will be omitted.

Referring to FIG. 7, there is formed an opening defined by the sloped surface 41d similar to the previous embodiment in the resin build-up layer 41B so as to expose the lower Cu interconnection pattern 41b by a laser beam processing, wherein the present embodiment forms a lower electrode 71 in such an opening as a part of the Cu interconnection pattern 41b formed on the top surface of the resin build-up layer 41B so as to cover the entirety of the sloped surface 41d and further a part of the top surface of the resin build-up layer 41B, and a ceramic high-K dielectric film 72 such as $BaTiO_3$, MgO, $Al_2O_3$, and the like, is formed on the lower electrode 71 as a capacitor insulation film by the aerosol deposition process explained previously.

Thereby, the lower electrode 71 forms a concaved shape conformal to the sloped surface 41d, and the ceramic high-K dielectric film 71 formed thereon also has a concaved shape corresponding to the lower electrode 71.

Further, the resin build-up layer 61B is formed on the resin build-up layer 41B so as to cover the lower electrode 71 and the ceramic high-K dielectric film 72, and an opening is formed in the resin build-up layer 61B so as to expose the ceramic high-K dielectric film 72. It should be noted that such an opening is formed by a laser beam processing similarly to the opening formed in the resin build-up layer 41B and is defined by a sloped surface 61d.

Further, there is formed an upper electrode 73 on the resin build-up layer 61B as a part of the Cu interconnection pattern 61b so as to cover the sloped surface 61d and the high-K dielectric film 72. Thereby, it should be noted that the top surface of the upper electrode 73 has a concaved shape conformal to the sloped surface 61d in the resin build-up layer 61B and the concaved shape of the ceramic high-K dielectric film 72.

Referring to FIG. 6 again, it becomes possible to integrate the capacitors D1-D6 on the circuit substrate 61 in the very proximity of the semiconductor devices 43A-43D by using the aerosol deposition process.

Similarly to the previous embodiment, the semiconductor devices 43A-43D may be an LSI chip or a package substrate or module substrate on which an LSI chip is mounted. In the case the semiconductor devices 43A-43D are an LSI chip, in particular, the capacitors D1-D5 are formed in the very proximity of the LSI chip, and with this, it becomes possible to suppress the problem of increase of inductance and increase of unnecessary electromagnetic radiation that is caused in the case the capacitor wiring is provided separately.

Next, the fabrication process of the electronic apparatus of FIG. 6 will be explained, with reference to FIGS. 8A-8L.

Figure 8A:
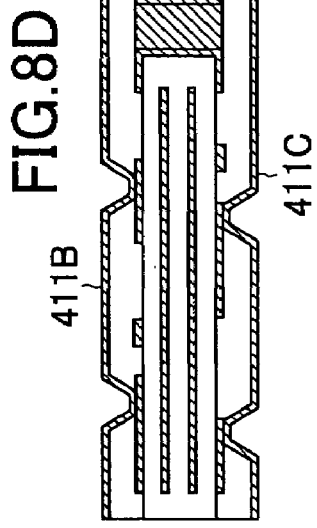
FIGS. 8A-8L are diagrams showing the fabrication process of the circuit substrate and the electronic apparatus of FIG. 6.
Figure 8B:
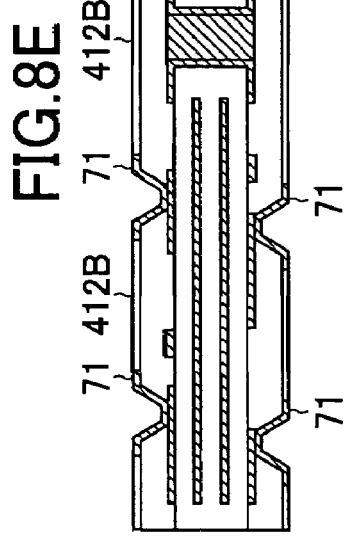
Figure 8C:
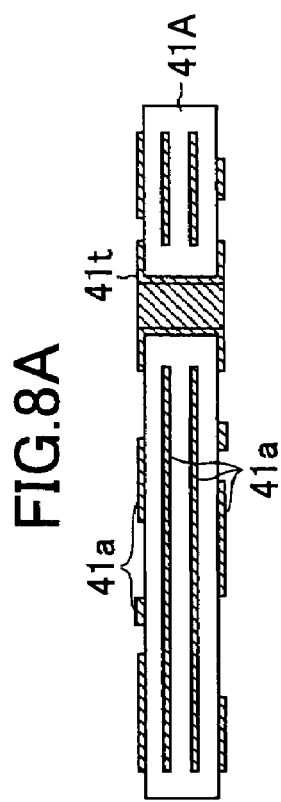

The process steps of FIGS. 8A-8C are identical with those of FIGS. 5A-5C, and openings c1-c6 are formed in the resin build-up layers 41B and 41C by a laser beam processing in correspondence to the regions reserved for formation of the capacitors.

Figure 8D:
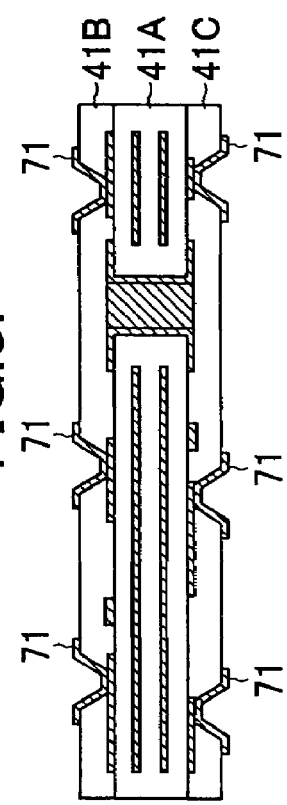
Figure 8E:
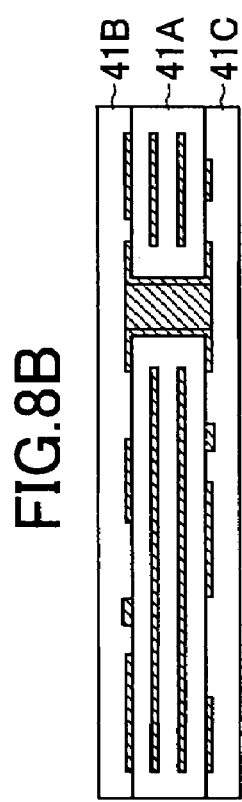

With the present embodiment, Cu seed layers 411B and 411C are formed on the resin build-up layers 41B and 41C by a non-electrolytic plating process so as to include the openings c1-c6 in the step of FIG. 8D, contrary to the step of FIG. 5D, and the lower electrode 71 of FIG. 7 is formed on the Cu seed layers 411B and 411C in the step of FIG. 8E by an electrolytic plating process of Cu while using resist patterns 412B and 412C as a plating mask.

Figure 8F:
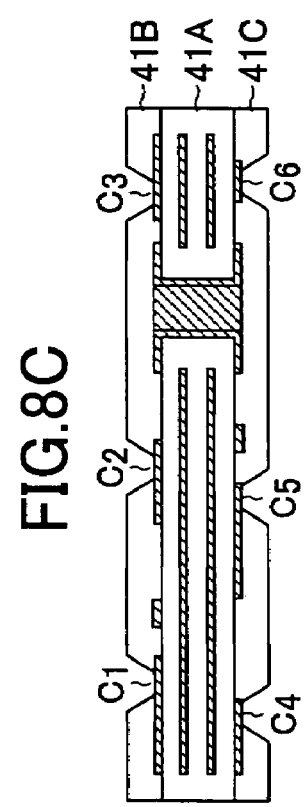
Figure 8G:
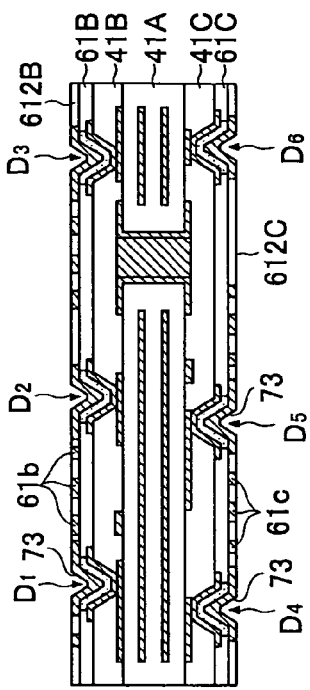

Next in the step of FIG. 8F, the plating resist patterns 412B and 412C are removed, and the resin build-up layer 61B is formed on the resin build-up layer 41B and the resin build-up layer 61C is formed on the resin build-up layer 41C in the step of FIG. 8G.

Figure 8H:
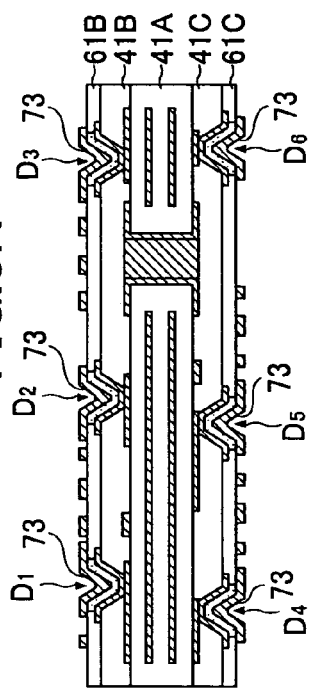

Further, in the step of FIG. 8H, openings are formed in the resin build-up layers 61B and 61C by a laser beam processing in the regions reserved for the capacitors D1-D6 so as to expose the lower electrode 71. Further, while using the resist pattern 61R as a mask, the ceramic high-K dielectric film 72 is formed on the exposed lower electrode 71 by the aerosol deposition process. In FIG. 8H, it is possible to omit the resist pattern 61R similarly to the process of FIG. 5D explained before.

Figure 8I:
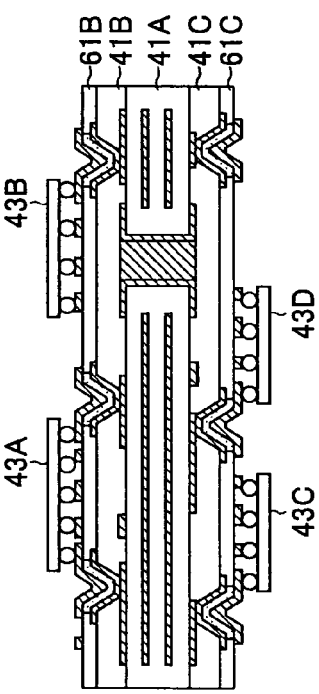

Next the resist pattern 61R is removed in the step of FIG. 8I, and the Cu seed layers 611B and 611C are formed respectively on the resin build-up layers 61B and 61C by a non-electrolytic plating process.

Figure 8J:
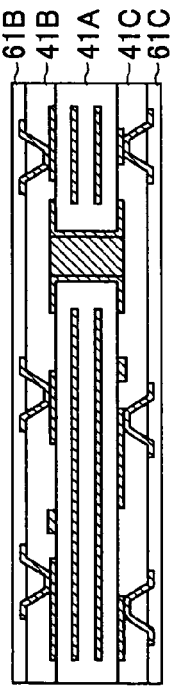

Further, in the step of FIG. 8J, a Cu layer is formed on the Cu seed layers 611B and 611C by an electrolytic plating process while using the resist patterns 612B and 612C for the mask, and with this, the upper electrode 73 and the Cu interconnection patterns 61b and 61c are formed. With this, the capacitors D1-D6 are formed in the resin build-up layers 61B and 61C.

Figure 8K:
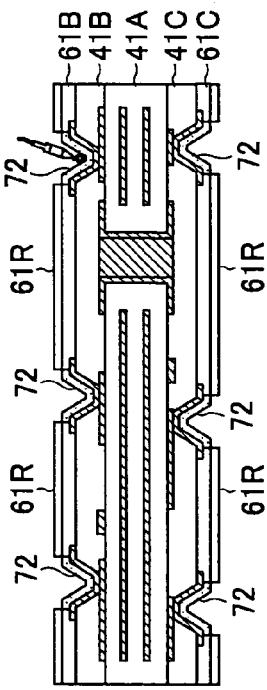
Figure 8L:
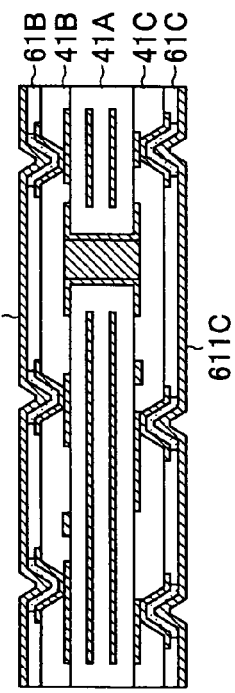

Next the plating resist pattern 612B, 612C are removed with the process of FIG. 8(K) and fabrication of the electronic apparatus 60 is completed by mounting the semiconductor devices 43A-43D in the step of FIG. 8L.

While the foregoing embodiments have been explained for the case of forming the ceramic high-K dielectric film 52 or 72 by the aerosol deposition process, it should be noted that the present invention is not limited to such an aerosol deposition process and it is also possible to form the ceramic high-K dielectric films by other low temperature film formation process, such as sputtering process.

Further, while the present invention has been explained for preferred embodiments, it should be noted that the present invention is by no means limited to such a particular embodiment but various variations or modifications may be made without departing from the scope of the invention.

What is claimed is:

1. A circuit substrate comprising a lamination of plural resin insulation films and including, on a surface and in an interior of said circuit substrate, plural interconnection layers, one of said plural resin insulation films being formed on a first conductor pattern constituting one of said plural interconnection layers in such a manner that a bottom principal surface of said resin insulation film makes a contact with a surface of said first conductor pattern, said resin insulation film including an opening defined by a sloped surface and exposing said first conductor pattern at said bottom principal surface, a ceramic high-K dielectric film being formed at a bottom of said opening in contact with said surface of said first conductor pattern, wherein there is formed a second conductor pattern constituting one of said plural interconnection layers on said resin insulation film so as to cover said sloped surface and in contact with a surface of said ceramic high-K dielectric film.

2. The circuit substrate as claimed in claim 1, wherein said second conductor pattern is formed on a surface of said circuit substrate and a bump electrode of a semiconductor device is connected to said second conductor pattern.

3. An electronic apparatus, comprising:

a circuit substrate; and a semiconductor device mounted upon said circuit substrate, said circuit substrate comprising a lamination of plural resin insulation films and including, on a surface and in an interior of said circuit substrate, plural interconnection layers, one of said plural resin insulation films being formed on a first conductor pattern constituting one of said plural interconnection layers in such a manner that a bottom principal surface of said resin insulation film makes a contact with a surface of said first conductor pattern, said resin insulation film including an opening defined by a sloped surface and exposing said first conductor pattern at said bottom principal surface, a ceramic high-K dielectric film being formed at a bottom of said opening in contact with said surface of said first conductor pattern, wherein there is formed a second conductor pattern constituting one of said plural interconnection layers on said resin insulation film so as to cover said sloped surface and in contact with a surface of said ceramic high-K dielectric film.

4. A circuit substrate comprising a lamination of plural resin insulation films and including, on a surface and in an interior of said circuit substrate, plural interconnection layers, said circuit substrate comprising:

a first resin insulation film constituting one of said plural resin insulation films and formed over a first conductor pattern constituting one of said plural interconnection layers, in such a manner that a bottom principal surface of said first resin insulation film makes a contact with a surface of said first conductor pattern, said first resin insulation film including a first opening defined by a sloped surface, said first opening exposing said first conductor pattern at a bottom of said first opening;

a lower electrode pattern formed over said first resin insulation film in contact with a surface of said first conductor pattern exposed at said bottom of said first opening, said lower electrode pattern having a shape conformal to a shape of said sloped surface of said first opening and having a depressed top surface corresponding to said first opening;

a second resin insulation film constituting one of said plural resin insulation films and formed over said first resin insulation film so as to cover said lower electrode pattern, said second resin insulation film including a second opening formed in correspondence to said first opening and exposing said lower electrode pattern, a ceramic high-K dielectric film formed in said second opening on said depressed top surface of said lower electrode pattern in conformity with a shape of said depressed top surface of said lower electrode pattern, said ceramic high-K dielectric film having a depressed top surface conformal to a shape of said depressed top surface of said lower electrode pattern, wherein there is provided a second conductor pattern constituting one of said plural interconnection layers on said second resin insulation film such that said second conductor pattern makes a contact with said depressed top surface of said ceramic high-K dielectric film at said second opening.

5. The circuit substrate as claimed in claim 4, wherein said second conductor pattern is formed on said surface of said circuit substrate, and wherein a bump electrode of a semiconductor element is jointed to said second conductor pattern.

6. An electronic apparatus, comprising a circuit substrate and a semiconductor device mounted upon said circuit substrate, said circuit substrate comprising a lamination of plural resin insulation films and including, on a surface and in an interior of said circuit substrate, plural interconnection layers, said circuit substrate comprising:

a first resin insulation film constituting one of said plural resin insulation films and formed over a first conductor pattern constituting one of said plural interconnection layers, in such a manner that a bottom principal surface of said first resin insulation film makes a contact with a surface of said first conductor pattern, said first resin insulation film including a first opening defined by a sloped surface, said first opening exposing said first conductor pattern at a bottom of said first opening;

a lower electrode pattern formed over said first resin insulation film in contact with a surface of said first conductor pattern exposed at said bottom of said first opening, said lower electrode pattern having a shape conformal to a shape of said sloped surface of said first opening and having a depressed top surface corresponding to said first opening;

a second resin insulation film constituting one of said plural resin insulation films and formed over said first resin insulation film so as to cover said lower electrode pattern, said second resin insulation film including a second opening formed in correspondence to said first opening and exposing said lower electrode pattern, a ceramic high-K dielectric film formed in said second opening on said depressed top surface of said lower electrode pattern in conformity with a shape of said depressed top surface of said lower electrode pattern, said ceramic high-K dielectric film having a depressed top surface conformal to a shape of said depressed top surface of said lower electrode pattern, wherein there is provided a second conductor pattern constituting one of said plural interconnection layers on said second resin insulation film such that said second conductor pattern makes a contact with said depressed top surface of said ceramic high-K dielectric film at said second opening.

7. A method of producing a circuit substrate in the form of lamination of plural resin insulation films such that plural interconnection layers are formed on a surface and in an interior of said circuit substrate, one of said plural resin insulation films being formed on a first conductor pattern constituting one of said plural interconnection layers in such a manner that a principal surface of said insulation film makes a contact with a surface of said first conductor pattern, said method comprising the steps of:

forming an opening in said insulation film by a laser beam processing such that said first conductor pattern is exposed;

forming a ceramic high-K dielectric film at a bottom of said opening in contact with said first conductor pattern selectively by an aerosol deposition process; and forming a second conductor pattern on said insulation film in contact with said high-K dielectric ceramic film in said opening.

8. A method of producing a circuit substrate in the form of lamination of plural resin insulation films such that plural interconnection layers are formed on a surface and in an interior of said circuit substrate, comprising the steps of:

forming a first insulation film constituting one of said plural resin insulation films on a first conductor pattern constituting one of said plural interconnection layers, such that a bottom principal surface of said first insulation film makes a contact with a surface of said first conductor pattern;

forming a first opening in said first insulation film by a laser beam processing such that said first opening exposes said conductor pattern;

forming a lower electrode pattern on said first insulation film so as to cover a sidewall surface of said first opening and make contact with said first conductor pattern at a bottom of said opening;

forming a second insulation film constituting one of said plural resin insulation films over said first insulation film so as to cover said lower electrode pattern;

forming a second opening in said second insulation film in correspondence to said first opening by a laser beam processing such that said second opening exposes said lower electrode pattern;

forming a ceramic high-K dialectic film on said exposed lower electrode pattern selectively by an aerosol deposition process; and forming an upper electrode pattern on said second insulation film so as to cover said ceramic high-K dielectric film at said second opening.

* * * * *